(12) United States Patent
Kim et al.

(10) Patent No.: US 10,535,842 B2
(45) Date of Patent: Jan. 14, 2020

(54) ORGANIC LIGHT EMITTING DIODE

(71) Applicant: Samsung Display Co., Ltd., Yongin-Si, Gyeonggi-Do (KR)

(72) Inventors: Myeong Suk Kim, Hwaseong-si (KR); Sung Wook Kim, Hwaseong-si (KR); Chang Woong Chu, Hwaseong-si (KR); Jin Soo Hwang, Seoul (KR); Sang Hoon Yim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/136,120

(22) Filed: Sep. 19, 2018

(65) Prior Publication Data

US 2019/0019992 A1   Jan. 17, 2019

Related U.S. Application Data

(63) Continuation of application No. 15/455,996, filed on Mar. 10, 2017, now Pat. No. 10,084,157.

(30) Foreign Application Priority Data

Apr. 7, 2016   (KR) .................. 10-2016-0042916

(51) Int. Cl.
  *H01L 51/52*   (2006.01)
  *H01L 51/50*   (2006.01)
  *H01L 27/32*   (2006.01)

(52) U.S. Cl.
  CPC ...... *H01L 51/5284* (2013.01); *H01L 27/3206* (2013.01); *H01L 51/504* (2013.01); *H01L 51/5253* (2013.01); *H01L 51/5265* (2013.01)

(58) Field of Classification Search
  CPC .................................................. H01L 51/5284
  See application file for complete search history.

(56) References Cited

U.S. PATENT DOCUMENTS

| 7,285,341 | B2 * | 10/2007 | Zheng | C07C 13/62 |
| | | | | 252/301.16 |
| 9,095,033 | B2 | 7/2015 | Naraoka et al. | |
| 2004/0018383 | A1 * | 1/2004 | Aziz | C07D 219/06 |
| | | | | 428/690 |
| 2007/0003784 | A1 * | 1/2007 | Begley | C09K 11/06 |
| | | | | 428/690 |
| 2007/0092755 | A1 * | 4/2007 | Begley | C09K 11/06 |
| | | | | 428/690 |

(Continued)

FOREIGN PATENT DOCUMENTS

| JP | 2006-156390 A | 6/2006 |
| JP | 2006-302878 A | 11/2006 |

(Continued)

*Primary Examiner* — William A Harriston
(74) *Attorney, Agent, or Firm* — Innovation Counsel LLP (57) ABSTRACT

The described technology relates to an organic light emitting diode including: a first electrode; a second electrode overlapping the first electrode; an organic emission layer between the first electrode and the second electrode; and a capping layer on the second electrode, wherein the capping layer has an absorption rate of 0.25 or more for light having a wavelength of 405 nm, thereby preventing degradation of the organic emission layer by blocking the light of the harmful wavelength region and providing the organic light emitting diode in which a blue emission efficiency is not deteriorated.

28 Claims, 4 Drawing Sheets

(56) References Cited

U.S. PATENT DOCUMENTS

2015/0287920 A1   10/2015   Nagaoka et al.

FOREIGN PATENT DOCUMENTS

| JP | 2007-103303 A | 4/2007 |
|----|---|---|
| KR | 10-2006-0059068 A | 1/2006 |
| KR | 10-0700013 B1 | 3/2007 |
| KR | 10-0883306 B1 | 2/2009 |
| KR | 10-2011-0061317 A | 6/2011 |
| KR | 10-2012-0080536 A | 7/2012 |
| KR | 10-2015-0077178 A | 7/2015 |
| WO | 01/039554 A1 | 5/2001 |

* cited by examiner

ORGANIC LIGHT EMITTING DIODE

CROSS-REFERENCE TO RELATED APPLICATION(S)

This application is a continuation application of U.S. patent application Ser. No. 15/455,996 filed on Mar. 10, 2017, which claims priority to and the benefit of Korean Patent Application No. 10-2016-0042916 filed in the Korean Intellectual Property Office on Apr. 7, 2016, the entire contents of which are incorporated herein by reference.

BACKGROUND (a) Technical Field

The disclosure relates to an organic light emitting diode, and more specifically, relates to an organic light emitting diode that perceives minimal damage from radiation of a harmful wavelength.

(b) Description of the Related Art

Recently, display devices including an organic light emitting diode has become increasingly popular. As more people use the display device including the organic light emitting diode, the display device becomes used in a wider range of environments than before.

However, in the display device including the organic light emitting diode, the organic emission layer is easily damaged by elements in the environment. This results in an undesirably short product life span. There is a need for a display device that is usable in various environments and offers excellent light efficiency without being so vulnerable to environmental elements.

The above information disclosed in this Background section is for enhancement of understanding of the background of the invention and therefore it may contain information that does not form the prior art that is already known in this country to a person of ordinary skill in the art.

SUMMARY

Exemplary embodiments provide an organic light emitting diode that is prevented from being degraded by a harmful wavelength.

An organic light emitting diode according to an exemplary embodiment of the described technology includes: a first electrode; a second electrode overlapping the first electrode; an organic emission layer between the first electrode and the second electrode; and a capping layer on the second electrode, wherein the capping layer has an absorption rate of 0.25 or more for light having a wavelength of 405 nm.

The capping layer may have an absorption rate of less than 0.25 in a 430 nm wavelength.

The capping layer may satisfy the following condition:

$k_1 - k_2 > 0.10$ wherein $k_1$ is the absorption rate in the 405 nm wavelength, and $k_2$ is the absorption rate in the 430 nm wavelength.

The capping layer may have a refractive index of 2.0 or more in a wavelength range from 430 nm to 470 nm.

The organic emission layer may include a blue emission layer, and a light emission spectrum peak wavelength of a blue emission material included in the blue emission layer may be 430 nm to 500 nm.

The second electrode may have light transmittance of 20% or more in the wavelength range of 430 nm to 500 nm.

The organic emission layer may include a blue emission layer, a red emission layer, and a green emission layer, and the capping layer may respectively overlap the blue emission layer, the red emission layer, and the green emission layer.

The capping layer may include a carbon atom and a hydrogen atom, and may include at least one selected from a group including an aromatic hydrocarbon compound, an aromatic heterocyclic compound, and an amine compound, including a substituent having at least one in a group including an oxygen atom, a sulfur atom, a nitrogen atom, a fluorine atom, a silicon atom, a chlorine atom, a bromine atom, and an iodine atom.

The capping layer may have a thickness of 200 nm or less.

The capping layer may have an absorption rate of 1.0 or less in the 405 nm wavelength.

The capping layer may block light of a 405 nm wavelength by 50% or more.

The organic emission layer may be combined with a plurality of layers representing different colors to emit white light.

The plurality of layers may include a structure in which 2 layers or 3 layers are deposited.

According to the exemplary embodiments, by blocking the light of the harmful wavelength region, the degradation of the organic emission layer may be prevented and the organic light emitting diode in the blue emission efficiency may not be deteriorated.

DETAILED DESCRIPTION

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

In order to clearly explain the described technology, aspects or portions that are not directly related to the described technology are omitted, and the same reference numerals are attached to the same or similar constituent elements throughout the entire specification.

In addition, the size and thickness of each configuration shown in the drawings are arbitrarily shown for better understanding and ease of description, and the described technology is not limited thereto. In the drawings, the thickness of layers, films, panels, regions, etc., are exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "on a plane" means viewing the object portion from the top, and the phrase "on a cross-section" means viewing a portion of the object that is vertically cut from the side.

Figure 1:
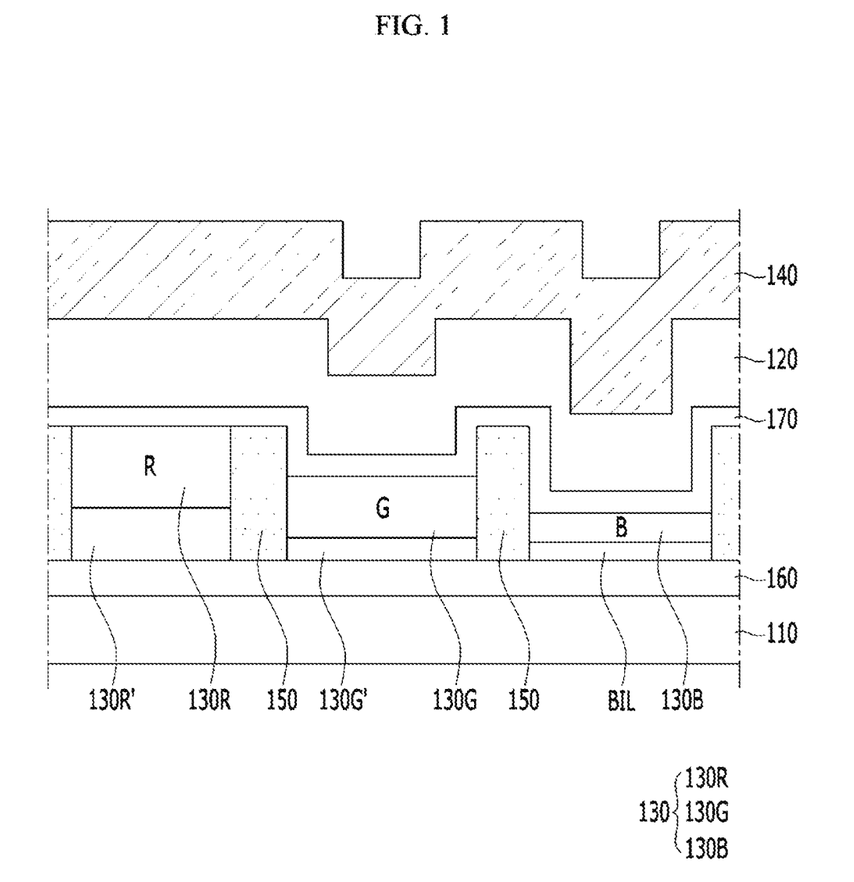
FIG. 1 is a view schematically showing a structure of an organic light emitting diode according to an exemplary embodiment of the described technology.

FIG. 1 is a view schematically showing a structure of an organic light emitting diode according to the present exemplary embodiment. As shown in FIG. 1, an organic light emitting diode according to the present exemplary embodiment includes a first electrode 110, a second electrode 120, an organic emission layer 130, and a capping layer 140.

The first electrode 110 is formed on the substrate and may serve an anode function to emit electrons into the organic emission layer 130. However, it is not limited thereto, and when the second electrode 120 functions as the anode, the first electrode 110 may be a cathode.

The organic light emitting diode according to the present exemplary embodiment may be a top emission organic light emitting diode. Accordingly, the first electrode 110 may serve as a reflection layer not emitting light emitted from the organic emission layer 130 to a rear surface. Here, the reflection layer means a layer having a characteristic of reflecting the light emitted from the organic emission layer 130 so as to not be emitted through the second electrode 120 to the outside. The reflection characteristic may mean that reflectivity of incident light is about 70% or more to about 100% or less, or about 80% or more to about 100% or less.

The first electrode 110 according to the present exemplary embodiment may include silver (Ag), aluminum (Al), chromium (Cr), molybdenum (Mo), tungsten (W), titanium (Ti), gold (Au), palladium (Pd), or alloys thereof to be used as the reflection layer while having the anode function, and may be a triple layer structure of silver (Ag)/indium tin oxide (ITO)/silver (Ag) or indium tin oxide (ITO)/silver (Ag)/indium tin oxide (ITO).

The second electrode 120 is disposed to overlap the first electrode 110 via the organic emission layer 130 interposed therebetween with the first electrode 110, as described later. The second electrode 120 according to the present exemplary embodiment may function as the cathode. However, it is not limited thereto, and when the first electrode 110 functions as the cathode, the second electrode 120 may be the anode.

The second electrode 120 according to the present exemplary embodiment may be a transflective electrode for the light emitted from the organic emission layer 130 to be emitted to the outside. Here, the transflective electrode means an electrode having a transflective characteristic transmitting part of the light incident to the second electrode 120 and reflecting a remaining part of the light to the first electrode 110. Here, the transflective characteristic may mean that the reflectivity for the incident light is about 0.1% or more to about 70% or less, or about 30% or more to about 50% or less.

The second electrode 120 according to the present exemplary embodiment may include an oxide such as ITO or IZO, or silver (Ag), magnesium (Mg), aluminum (Al), chromium (Cr), molybdenum (Mo), tungsten (W), titanium (Ti), gold (Au), palladium (Pd), or alloys to have the transflective characteristic and simultaneously to have electrical conductivity.

In this case, the second electrode 120 of the present exemplary embodiment to smoothly emit the light emitted from the organic emission layer 130 to the outside, particularly, to smoothly emit the light of a blue series, may have light transmittance of about 20% or more for light of a 430 nm to 500 nm wavelength. This is a minimum light transmittance to realize a color through the organic light emitting diode according to the present exemplary embodiment, and closer to 100% is preferred.

In the organic emission layer 130, holes and electrons respectively transmitted from the first electrode 110 and the second electrode 120 meet, thereby forming an exciton to emit light. In FIG. 1, the organic emission layer 130 includes a blue emission layer 130B, and may further include a red emission layer 130R and a green emission layer 130G, or may have a single layer structure in which the blue emission layer 130B, the red emission layer 130R, and the green emission layer 130G are respectively disposed in the same layer on the first electrode 110.

Blue, red, and green are three primary colors to realize the color, and combinations thereof may realize various colors. The blue emission layer 130B, the red emission layer 130R, and the green emission layer 130G respectively form a blue pixel, a red pixel, and a green pixel. The blue emission layer 130B, the red emission layer 130R, and the green emission layer 130G may be disposed on an upper surface of the first electrode 110.

A hole transmission layer 160 may be further included between the first electrode 110 and the organic emission layer 130. The hole transmission layer 160 may include at least one of a hole injection layer and a hole transport layer. The hole injection layer facilitates the injection of the hole from the first electrode 110, and the hole transport layer transports the hole from the hole injection layer. The hole transmission layer 160 may be formed of a dual layer in which the hole transport layer is formed on the hole injection layer, and may be formed of the single layer in which the material forming the hole injection layer and the material forming the hole transport layer are mixed.

An electron transmission layer 170 may be further included between the second electrode 120 and the organic emission layer 130. The electron transmission layer 170 may include at least one of an electron injection layer and an electron transport layer. The electron injection layer facilitates the injection of the electron from the second electrode 120, and the electron transport layer transports the electron transmitted from the electron injection layer. The electron transmission layer 170 may be formed of a dual layer in which the electron transport layer is formed on the electron injection layer, and may be formed of the single layer in which the material forming the electron injection layer and the material forming the electron transport layer are mixed.

However, the inventive concept is not limited thereto, and the organic light emitting diode according to the exemplary variation may include the organic emission layer 130 having the multi-layered structure. This will be further described with reference to FIG. 2.

Figure 2:
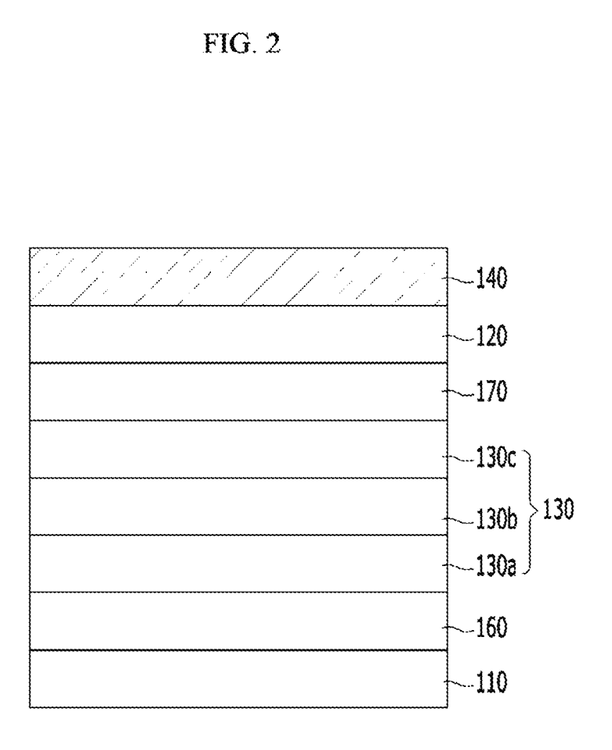
FIG. 2 is a view schematically showing a structure of an organic light emitting diode according to another exemplary embodiment of the described technology.

FIG. 2 schematically shows the organic light emitting diode including the organic emission layer 130 having the multi-layered structure according to another exemplary embodiment of the described technology.

In the exemplary embodiment shown in FIG. 2, configurations except for the organic emission layer 130 are similar to the configurations of the organic light emitting diode according to the exemplary embodiment described with reference to FIG. 1. Accordingly, the first electrode 110 and the second electrode 120 are disposed to be overlapped, the organic emission layer 130 is between the first electrode 110 and the second electrode 120, and the capping layer 140 is on the second electrode 120.

In this case, the organic emission layer 130 according to the present exemplary embodiment is formed by depositing a plurality of layers 130a, 130b, and 130c. The layers 130a, 130b, and 130c of the organic emission layer 130 respectively represent the different colors, thereby emitting white-colored light by combination.

As shown in FIG. 2, the organic emission layer 130 according to the present exemplary embodiment may have the three-layered structure in which three layers 130a, 130b, and 130c are deposited; however, the inventive concept is not limited thereto, and the organic emission layer 130 may have a structure made of two layers.

As one example, the organic emission layer 130 of the three-layered structure may include a blue emission layer 130a, a yellow emission layer 130b, and a blue emission layer 130c. However, this is not a limitation of the disclosed concept thereto, and any emission layer capable of emitting white light by the color combination may be included in an exemplary embodiment range of the described technology.

Also, although not shown in the drawing, in the case of the organic emission layer of a two-layered structure, each layer may include the blue emission layer and the yellow emission layer.

In addition, although not shown in the drawing, a charge generation layer may be between adjacent layers among the plurality of layers 130a, 130b, and 130c of FIG. 2.

In the display device using the organic light emitting diode according to the present exemplary embodiment, to convert the emitted white light into the other colors, a color filter layer disposed on the second electrode 120 may be further included.

For example, the color filter layer may convert the white light passing through the second electrode 120 into blue, red, or green, and for this, a plurality of sub-color filter layers respectively corresponding to a plurality of sub-pixels of the organic light emitting diode may be included. The color filter layer converts the color of the light emitted from the second electrode 120 such that various position designs may be possible if the color filter layer is only disposed on the second electrode 120.

To protect the display device from external moisture or oxygen, the color filter layer may be disposed on or under an encapsulation layer, and various arrangement structures of the color filter layers are possible, such that the embodiment range of the present exemplary embodiment may be applied to these arrangement structures.

The organic light emitting diode according to the exemplary embodiment shown in FIG. 2 is the same as the exemplary embodiment shown in FIG. 1 except for the emission of white light by including the organic emission layer 130 made of the plurality of layers 130a, 130b, and 130c stacked on top of one another. Therefore, the following is described with reference to the organic light emitting diode shown in FIG. 1. The following description for the organic light emitting diode may be equally applied to the exemplary embodiment shown in FIG. 2.

The blue emission material included in the blue emission layer 130B according to the present exemplary embodiment has a range of a peak wavelength of about 430 nm to 500 nm in a photoluminescence (PL) spectrum.

As shown in FIG. 1, an auxiliary layer BIL to increase efficiency of the blue emission layer 130B may be under the blue emission layer 130B. The auxiliary layer BIL may have the function of increasing the efficiency of the blue emission layer 130B by controlling a hole charge balance.

Similarly, as shown in FIG. 1, a red resonance auxiliary layer 130R' and a green resonance auxiliary layer 130G' may be respectively under the red emission layer 130R and the green emission layer 130G. The red resonance auxiliary layer 130R' and the green resonance auxiliary layer 130G' are added in order to match a resonance distance for each color. Alternatively, the separate resonance auxiliary layer may not be formed under the blue emission layer 130B and the auxiliary layer BIL.

A pixel definition layer 150 may be on the first electrode 110. The pixel definition layer 150, as shown in FIG. 1, is respectively between the blue emission layer 130B, the red emission layer 130R, and the green emission layer 130G, thereby dividing the emission layers for each color.

The capping layer 140 is formed on the second electrode 120 to control a length of a light path of the element, thereby adjusting an optical interference distance. In this case, the capping layer 140 according to the present exemplary embodiment, differently from the auxiliary layer BIL, the red resonance auxiliary layer 130R', and the green resonance auxiliary layer 130G', as shown in FIG. 1, may be commonly provided in each of the blue pixel, the red pixel, and the green pixel.

The organic emission layer 130 according to the present exemplary embodiment, particularly, in reaction to being exposed to light such as sunlight, is damaged by the wavelength near 405 nm such that the performance of the organic light emitting diode may be deteriorated. Accordingly, 405 nm is the wavelength of the light that causes the organic light emitting diode to deteriorate, and will herein be referred to as "harmful wavelength."

The capping layer 140 according to the present exemplary embodiment is formed by including a material that blocks the light near the 405 nm that is the harmful wavelength region among the light incident to the organic emission layer 130 to prevent the degradation of the organic emission layer 130 included in the organic light emitting diode.

The capping layer 140 according to the present exemplary embodiment may include a material satisfying Equation 1 below.

$$k_1 - k_2 > 0.10 \qquad \text{[Equation 1]}$$

In Equation 1, $k_1$ is the absorption rate of the light having the wavelength of 405 nm, and $k_2$ is the absorption rate of the light having the wavelength of 430 nm.

To block the light of the 405 nm region as the harmful wavelength region, the capping layer 140 according to the present exemplary embodiment may have $k_1$ of 0.25 or more as an absorption rate at 405 nm. When $k_1$ is less than 0.25, the capping layer 140 according to the present exemplary embodiment does not effectively block the light of a 405 nm wavelength of the harmful wavelength region such that it is difficult to obtain the effect of preventing the degradation of the organic emission layer 130.

According to the present exemplary embodiment, absorption rates $k_1$ and $k_2$ and a refractive index described below are values that are measured by using FILMETRICS F10-RT-UV equipment after forming the capping layer 140 according to the present exemplary embodiment by depositing the organic material on a silicon substrate as a thin film having a thickness of 70 nm.

As $k_1$ increases, more of the light in a 405 nm range of the harmful wavelength region is blocked. As one example of the present exemplary embodiment, the material forming the capping layer 140 may be selected such that $k_1$ is 0.8 or less, and preferably, the material forming the capping layer 140 may be selected in a range such that $k_1$ is 1.0 or less. However, this is only one example, and the selection range of the material forming the capping layer 140 may be determined by considering various factors such as the thickness of the capping layer 140 and a usage environment.

On the other hand, the organic emission layer 130 according to the present exemplary embodiment has high transmittance for light of a 430 nm wavelength as the blue light while blocking the light of a 405 nm wavelength as being in the harmful wavelength region. Hence, the damaging wavelength is blocked without compromising the efficiency of the blue series light. For this, the capping layer 140 according to the present exemplary embodiment may have an absorption rate $k_2$ of less than 0.25 for the light of the 430 nm wavelength as the wavelength of the blue series light.

When $k_2$ is larger than 0.25, the ratio of the blue light that is absorbed by the capping layer 140 is increased such that it may be difficult to achieve the various colors through the organic light emitting diode according to the present exemplary embodiment.

As $k_2$ gets closer to 0, the ratio of the blue light absorbed by the capping layer 140 is decreased such that the efficiency of the blue light may be increased.

In this case, the capping layer 140 according to the present exemplary embodiment may include a material having the high refractive index for the blue series light. This way, the emission efficiency in the blue region is not compromised. In detail, the capping layer 140 according to the present exemplary embodiment may have the refractive index of 2.0 or more in the wavelength range of 430 nm to 470 nm. If the refractive index of the capping layer 140 is increased, a resonance effect may be further generated by the refraction such that the emission efficiency may be increased.

To smoothly generate the resonance effect, the capping layer 140 according to the present exemplary embodiment may have a 200 nm or less (0 is not included) thickness. As one example, the capping layer 140 having a thickness of 60 nm to 80 nm may be formed, but this inventive concept is not limited thereto.

In Equation 1 above, it is preferable that a difference between $k_1$ and $k_2$ is large. Accordingly, in Equation 1, a difference between $k_1$ and $k_2$ may be larger than 0.1, which is a lower limit for the difference between the absorption rate $k_1$ for the light of a 405 nm wavelength as the harmful wavelength region and the absorption rate $k_2$ for the light of a 430 nm wavelength as the wavelength region of the blue series light.

In the case that the difference between $k_1$ and $k_2$ is smaller than 0.1, the light of the harmful wavelength region may still be blocked, but the emission efficiency of the blue light will likely decrease. Alternatively, the emission efficiency of the blue light may be maintained but the light of the harmful wavelength region may not be blocked effectively such that it is impossible to prevent the degradation of the organic emission layer 130.

Accordingly, to attain a desired level of emission efficiency of the blue light while effectively blocking the light in the harmful wavelength region, it is preferable that the difference between the absorption rate $k_1$ for the light of a 405 nm wavelength of the harmful wavelength region and the absorption rate $k_2$ for the light of a 430 nm wavelength of the wavelength region of the blue light is larger than 0.1. As the difference $k_1-k_2$ increases, the absorption rate of the light of the blue region decreases while a large percentage of the light of the harmful wavelength region gets absorbed, such that the overall efficiency may increase. It is further preferable that the difference between the absorption rate $k_1$ for the light of the 405 nm wavelength of the harmful wavelength region and the absorption rate $k_2$ for the light of the 430 nm wavelength of the wavelength region of the blue light is larger than 0.3, and more preferably, when the difference between the absorption rate $k_1$ for the light of the 405 nm wavelength of the harmful wavelength region and the absorption rate $k_2$ for the light of the 430 nm wavelength of the wavelength region of the blue light is larger than 0.5. The larger the difference between $k_1$ and $k_2$, the higher the light transmission of the blue region may be while more of the light of the harmful wavelength region is absorbed.

Therefore, it may be confirmed that larger than 0.1 for the difference between the absorption rate $k_1$ for the light of the 405 nm wavelength of the harmful wavelength region and the absorption rate $k_2$ for the light of the 430 nm wavelength of the wavelength region of the blue light is a threshold value of the lowest value capable of maintaining the efficiency transmission of the blue region light while absorbing the light of the harmful wavelength region.

The capping layer 140 according to the present exemplary embodiment as an organic material including a carbon atom and a hydrogen atom may include at least one selected from a group including an aromatic hydrocarbon compound, an aromatic heterocyclic compound, and an amine compound including a substituent having at least one selected from a group including an oxygen atom, a sulfur atom, a nitrogen atom, a fluorine atom, a silicon atom, a chlorine atom, a bromine atom, and an iodine atom.

A detailed example of a compound that may be used as the capping layer 140 according to the present exemplary embodiment may be a material according to Chemical Formula 1 to Chemical Formula 7 below.

Chemical Formula 1

N$^4$,N$^{4'}$-bis(4-(9H-carbazol-9-yl)phenyl)-N$^4$,N$^{4'}$-diphenyl-[1,1'-biphenyl]-4,4'-diamine

-continued

Chemical Formula 2

N⁴,N⁴'-di([1,1'-biphenyl]-4-yl)-N⁴,N⁴'-
bis(dibenzo[b,d]furan-2-yl)-[1,1'-biphenyl]-4,4'-diamine Chemical Formula 3

N⁴,N⁴'-([1,1'-biphenyl]-4,4'-diyl)bis(N⁴,N⁴',N⁴'-
triphenyl-[1,1'-biphenyl]-4,4'-diamine)

Chemical Formula 4

N⁴,N⁴'-di([1,1'-biphenyl]-4-yl)-N⁴,N⁴'-bis(4'-methyl-[1,1'-
biphenyl]-4-yl)-[1,1'-biphenyl]-4,4'-diamine Chemical Formula 5

N⁴,N⁴''-di([1,1'-biphenyl]-4-yl)-N⁴,N⁴''-diphenyl-[1,1':4',1''-
terphenyl]-4,4''-diamine Chemical Formula 6

N,N'-((9H-fluorene-9,9-diyl)bis(3,1-phenylene))bis(N-([1,1'-
biphenyl]-4-yl)-[1,1'-biphenyl]-4-amine)

Chemical Formula 7

N⁴,N⁴'-bis(dibenzo[b,d]thiophen-2-yl)-N⁴,N⁴'-bis(4'-
methyl-[1,1'-biphenyl]-4-yl)-[1,1'-biphenyl]-4,4'-diamine Hereinafter, to confirm the effect of the organic light emitting diode according to the present exemplary embodiment, among Chemical Formula 1 to Chemical Formula 7, Chemical Formula 1 to Chemical Formula 6 are selected as Exemplary Embodiment 1 to Exemplary Embodiment 6, and the materials such as Chemical Formula 8 and Chemical Formula 9 are selected as Comparative Example 1 and Comparative Example 2 to measure the absorption rate, the refractive index, and the blocking rate, and to confirm the blocking effect.

Chemical Formula 8

N⁴, N⁴'-diphenyl-N⁴, N⁴'-bis(9-phenyl-9H-carbazol-3-yl)-[1,1'-biphenyl]-4,4'-diamine Chemical Formula 9

N⁴, N⁴'-di(naphthalen-1-yl)-N⁴, N⁴'-diphenyl-[1,1'-biphenyl]-4,4'-diamine

Figure 3:
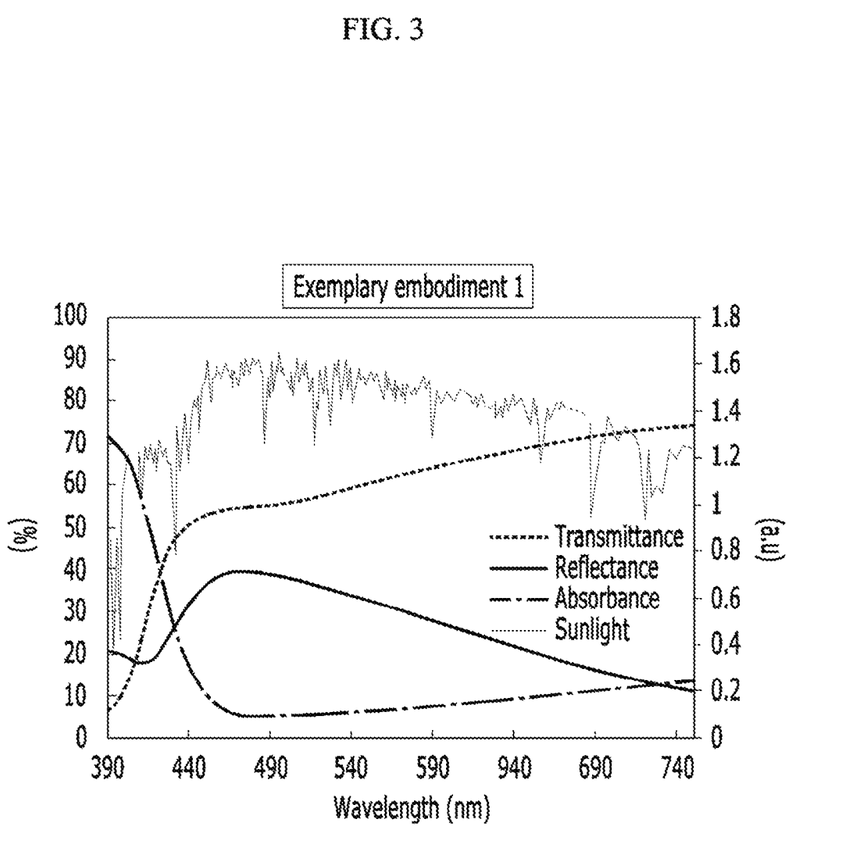
FIG. 3 is a graph showing an absorption rate, a refractive index, transmittance, and a sunlight spectrum of a capping layer material corresponding to Exemplary Embodiment 1.
Figure 4:
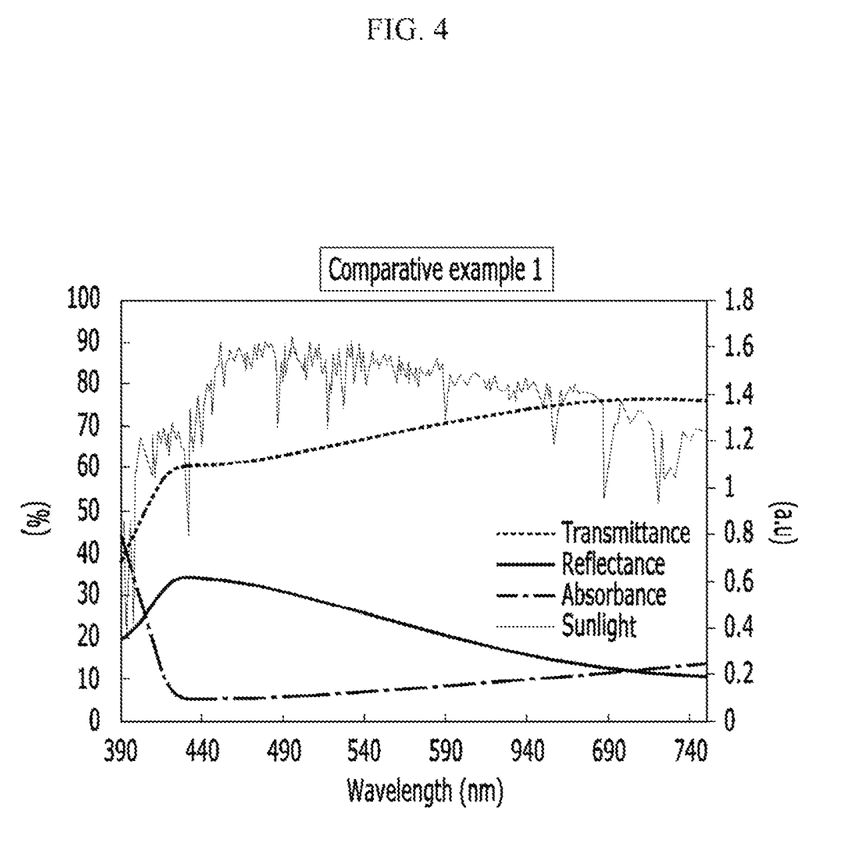
FIG. 4 is a graph showing an absorption rate, a refractive index, transmittance, and a sunlight spectrum of a capping layer material corresponding to Comparative Example 1.

FIG. 3 is a graph showing an absorption rate, a refractive index, transmittance, and a sunlight spectrum of a capping layer material corresponding to Exemplary Embodiment 1, and FIG. 4 is a graph showing an absorption rate, a refractive index, transmittance, and a sunlight spectrum of a capping layer material corresponding to Comparative Example 1, while the absorption rate, the refractive index, and the blocking rate for each material corresponding to Exemplary Embodiment 1 to Exemplary Embodiment 6, and Comparative Example 1 and Comparative Example 2, are measured and the calculated results are summarized in Table 1. "Blocking rate" means that "(incident light−transmitted light)/incident light×100."

TABLE 1

| Experiment | $k_1$ 405 nm | $k_2$ 430 nm | n 450 nm | $k_1$ 405 nm − $k_2$ 430 nm | Blocking rate 405 nm | Blocking effect 405 nm |
|---|---|---|---|---|---|---|
| Exemplary Embodiment 1 | 0.539 | 0.134 | 2.248 | 0.405 | 83.80% | 1.66 |
| Exemplary Embodiment 2 | 0.511 | 0.089 | 2.177 | 0.422 | 82.49% | 1.64 |
| Exemplary Embodiment 3 | 0.459 | 0.067 | 2.254 | 0.392 | 79.00% | 1.57 |
| Exemplary Embodiment 4 | 0.730 | 0.216 | 2.269 | 0.514 | 91.52% | 1.82 |
| Exemplary Embodiment 5 | 0.754 | 0.228 | 2.299 | 0.526 | 90.50% | 1.80 |
| Exemplary Embodiment 6 | 0.673 | 0.227 | 2.310 | 0.446 | 87.50% | 1.74 |
| Comparative Example 1 | 0.0800 | 0.00 | 1.920 | 0.080 | 50.29% | 1.00 |
| Comparative Example 2 | 0.248 | 0.00 | 2.269 | 0.248 | 66.38% | 1.28 |

As described in Table 1, the material for the capping layer 140 according to Comparative Example 1 and Comparative Example 2 has an absorption rate $k_1$ of less than 0.25 in a 405 nm wavelength. Comparative Example 1 having $k_2$ of 0 satisfies the condition of the present exemplary embodiment. However, the refractive index n in a 450 nm wavelength is less than 2 and the difference between $k_1$ and $k_2$ according to Equation 1 is smaller than 0.1 in Comparative Example 1. In Comparative Example 1, the conditions of the capping layer 140 according to the present exemplary embodiment except for $k_2$ are not all satisfied. In Comparative Example 2, $k_2$ is 0 and the difference between $k_1$ and $k_2$ according to Equation 1 is larger than 0.1, however the material $k_1$ has a refractive index n of 0.248, which is smaller than 0.25.

In this case, based on the blocking rate that Comparative Example 1 blocks the light of the 405 nm wavelength of the harmful wavelength region, the blocking rates of Exemplary Embodiment 1 to Exemplary Embodiment 6 and Comparative Example 2 are relatively calculated and are described as the blocking effect.

Even if the other conditions are all satisfied like Comparative Example 2 and the $k_1$ is only less than 0.25, it may be confirmed that the blocking effect of blocking the 405 nm wavelength of the harmful wavelength region is increased by 20% or more compared with Comparative Example 1.

However, as shown in Table 1, in the case of Exemplary Embodiment 1 to Exemplary Embodiment 6, it may be confirmed the effect of blocking the light of the 405 nm wavelength of the harmful wavelength region is exerted with a ratio of over 50% at a minimum compared with Comparative Example 1.

Also, when comparing Comparative Example 2 with Exemplary Embodiment 1 to Exemplary Embodiment 6, with reference to Exemplary Embodiment 3 in which the blocking effect is measured to be lowest is increased by 57% compared with Comparative Example 1, it may be confirmed that Comparative Example 2 has an increased blocking effect by more than half with respect to Exemplary Embodiment 3.

Next, while exposing the organic light emitting diode including the capping layer 140 according to Exemplary Embodiment 1 to Exemplary Embodiment 6, and Comparative Example 1 and Comparative Example 2, to the light source including a 405 nm wavelength of the harmful wavelength region for a predetermined time, a result of comparing the degree of degradation of the organic emission layer 130 included in the organic light emitting diode is described in Table 2. The light source used according to the present exemplary embodiment is an artificial sunlight source emitting artificial light that is similar to the sunlight spectrum.

TABLE 2

| | Color temperature (1 cycle: 8 h light source exposure time) | | Color temperature change amount |
|---|---|---|---|
| Experiment | 0 cycle (0 h) | 4 cycle 32 h | (ΔK) |
| Exemplary Embodiment 1 | 7207 K | 7257 K | 50 |
| Exemplary Embodiment 2 | 7312 K | 7373 K | 61 |
| Exemplary Embodiment 3 | 7189 K | 7270 K | 81 |
| Exemplary Embodiment 4 | 7283 K | 7293 K | 10 |
| Exemplary Embodiment 5 | 7190 K | 7202 K | 12 |
| Exemplary Embodiment 6 | 7260 K | 7283 K | 23 |

TABLE 2-continued

| Experiment | Color temperature (1 cycle: 8 h light source exposure time) | | Color temperature change amount |
|---|---|---|---|
| | 0 cycle (0 h) | 4 cycle 32 h | (ΔK) |
| Comparative Example 1 | 7136 K | 7703 K | 567 |
| Comparative Example 2 | 7334 K | 7746 K | 412 |

Each sample is manufactured to have a color temperature of 7200 K, as measured in a 0 cycle exposure time. Next, if each sample is exposed to the light source including a 405 nm wavelength of the harmful wavelength region for a predetermined time, the organic emission layer 130 included in each sample is damaged by the harmful wavelength such the color temperature is changed. Accordingly, it may be considered that the degradation of the organic emission layer 130 is largely generated when the color temperature change amount is large.

As shown in Table 2, in the case of Comparative Example 1 and Comparative Example 2, a temperature change is more than 400 K. When the color temperature change amount is 400 K or more, the white color change may be detected by the user or by the naked eye such that the sample is considered to be a defective panel. In contrast, in the case of Exemplary Embodiment 1 to Exemplary Embodiment 6, the change in color temperature is small, in the range of 10 K to 80 K. which is very different from 400 K at which the color temperature change amount can be detected by the naked eye.

Accordingly, compared with Comparative Example 1 and Comparative Example 2, the light of the 405 nm wavelength as the harmful wavelength region is blocked by the capping layer 140 included in Exemplary Embodiment 1 to Exemplary Embodiment 6. The presence of the capping layer 140 decreases the degradation of the organic emission layer 130.

In the above, the organic light emitting diode according to the present exemplary embodiment has been described. According to the described technology, the degradation of the organic emission layer 130 may be prevented by blocking the light of the harmful wavelength region, and the organic light emitting diode in which the blue emission efficiency is not deteriorated may be provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: first electrode
120: second electrode
130R: red emission layer
130R': red resonance auxiliary layer
130G: green emission layer
130G': green resonance auxiliary layer
130B: blue emission layer
BIL: auxiliary layer
140: capping layer
150: pixel definition layer
160: hole transmission layer
170: electron transmission layer

What is claimed is:

1. An organic light emitting diode comprising:
a first electrode;
a second electrode overlapping the first electrode;
an organic emission layer between the first electrode and the second electrode; and
a capping layer on the second electrode,
wherein the capping layer comprises a compound represented by the Chemical Formula A:

[Chemical Formula A]

A1 is

R1 to R4 are each independently selected from

-continued and

[Chemical Formula 2]

2. The organic light emitting diode of claim 1, wherein the capping layer has an absorption rate of 0.25 or more for light having a wavelength of 405 nm.
3. The organic light emitting diode of claim 1, wherein the capping layer has an absorption rate of less than 0.25 in a 430 nm wavelength.
4. The organic light emitting diode of claim 1, wherein the capping layer satisfies:

$k1-k2>0.10$ wherein k1 is the absorption rate in the 405 nm wavelength, and k2 is the absorption rate in the 430 nm wavelength.
5. The organic light emitting diode of claim 1, wherein the capping layer has a refractive index of 2.0 or more in the wavelength range from 430 nm to 470 nm.
6. The organic light emitting diode of claim 1, wherein the organic emission layer includes a blue emission layer, and
a light emission spectrum peak wavelength of a blue emission material included in the blue emission layer is 430 nm to 500 nm.
7. The organic light emitting diode of claim 1, wherein the second electrode has light transmittance of 20% or more in the wavelength range of 430 nm to 500 nm.
8. The organic light emitting diode of claim 1, wherein the organic emission layer includes a blue emission layer, a red emission layer, and a green emission layer, and the capping layer overlaps the blue emission layer, the red emission layer, and the green emission layer.
9. The organic light emitting diode of claim 1, wherein the compound represented by Chemical Formula A includes one of more selected from compounds represented by Chemical Formula 1 to Chemical Formula 7:

[Chemical Formula 3]

[Chemical Formula 4]

[Chemical Formula 1]

[Chemical Formula 5]

-continued

[Chemical Formula 6]

N,N'-((9H-fluorene-9,9-diyl)bis(3,1-phenylene))bis(N-([1,1'-biphenyl]-4-yl)-[1,1'-biphenyl]-4-amine)

[Chemical Formula 7]

10. The organic light emitting diode of claim 1, wherein the capping layer includes
a carbon atom and a hydrogen atom, and includes
at least one selected from a group including an aromatic hydrocarbon compound, an aromatic heterocyclic compound, and an amine compound, including a substituent having at least one of an oxygen atom, a sulfur atom, a nitrogen atom, a fluorine atom, a silicon atom, a chlorine atom, a bromine atom, and an iodine atom.

11. The organic light emitting diode of claim 1, wherein the capping layer has a thickness of 200 nm or less.

12. The organic light emitting diode of claim 1, wherein the capping layer has an absorption rate of 1.0 or less in the 405 nm wavelength.

13. The organic light emitting diode of claim 1, wherein the capping layer blocks light of a 405 nm wavelength by 50% or more.

14. The organic light emitting diode of claim 1, wherein the organic emission layer is combined with a plurality of layers representing different colors to emit white light.

15. The organic light emitting diode of claim 14, wherein the plurality of layers include a structure in which 2 layers or 3 layers are deposited.

16. An organic light emitting diode comprising:
a first electrode;
a second electrode overlapping the first electrode;
an organic emission layer between the first electrode and the second electrode; and
a capping layer on the second electrode,
wherein the capping layer satisfies:

$k1-k2>0.10$ wherein k1 is the absorption rate in the 405 nm wavelength, and k2 is the absorption rate in the 430 nm wavelength.

17. The organic light emitting diode of claim 16, wherein the capping layer has an absorption rate of 0.25 or more for light having a wavelength of 405 nm.

18. The organic light emitting diode of claim 16, wherein the capping layer has an absorption rate of less than 0.25 in a 430 nm wavelength.

19. The organic light emitting diode of claim 16, wherein the capping layer has a refractive index of 2.0 or more in the wavelength range from 430 nm to 470 nm.

20. The organic light emitting diode of claim 16, wherein the organic emission layer includes a blue emission layer, and
a light emission spectrum peak wavelength of a blue emission material included in the blue emission layer is 430 nm to 500 nm.

21. The organic light emitting diode of claim 16, wherein the second electrode has light transmittance of 20% or more in the wavelength range of 430 nm to 500 nm.

22. The organic light emitting diode of claim 16, wherein the organic emission layer includes a blue emission layer, a red emission layer, and a green emission layer, and
the capping layer overlaps the blue emission layer, the red emission layer, and the green emission layer.

23. The organic light emitting diode of claim 16, wherein the capping layer includes
a carbon atom and a hydrogen atom, and includes
at least one selected from a group including an aromatic hydrocarbon compound, an aromatic heterocyclic compound, and an amine compound, including a substituent having at least one of an oxygen atom, a sulfur atom, a nitrogen atom, a fluorine atom, a silicon atom, a chlorine atom, a bromine atom, and an iodine atom.

24. The organic light emitting diode of claim 16, wherein the capping layer has a thickness of 200 nm or less.

25. The organic light emitting diode of claim 16, wherein the capping layer has an absorption rate of 1.0 or less in the 405 nm wavelength.

26. The organic light emitting diode of claim 16, wherein the capping layer blocks light of a 405 nm wavelength by 50% or more.

27. The organic light emitting diode of claim 16, wherein the organic emission layer is combined with a plurality of layers representing different colors to emit white light.

28. The organic light emitting diode of claim 27, wherein the plurality of layers include a structure in which 2 layers or 3 layers are deposited.

* * * * *